US005744932A

United States Patent [19]
Kissel

[11] Patent Number: 5,744,932
[45] Date of Patent: Apr. 28, 1998

[54] APPARATUS AND METHOD FOR MONITORING BACKUP BATTERY FLOW CHARGE

[76] Inventor: William G. Kissel, 524 El Doro, Arlington, Tex. 76006

[21] Appl. No.: 577,477

[22] Filed: Dec. 22, 1995

[51] Int. Cl.$^6$ .................. H01M 10/44; H01M 10/48; G01N 27/416
[52] U.S. Cl. .................................... 320/48; 324/426
[58] Field of Search ........................ 320/48; 324/426, 324/432, 433; 307/66, 46, 48

[56] References Cited

U.S. PATENT DOCUMENTS

| | | |
|---|---|---|
| 4,138,670 | 2/1979 | Schneider et al. |
| 4,316,133 | 2/1982 | Locke, Jr. |
| 4,441,066 | 4/1984 | Burmenko ................... 320/48 |
| 4,618,857 | 10/1986 | Dubois et al. |
| 4,820,965 | 4/1989 | Siemer ....................... 320/31 |
| 4,929,931 | 5/1990 | McCuen |
| 5,047,961 | 9/1991 | Simonsen |
| 5,218,288 | 6/1993 | Mickal et al. |
| 5,457,377 | 10/1995 | Jonsson ....................... 320/5 |

Primary Examiner—Peter S. Wong
Assistant Examiner—Patrick B. Law
Attorney, Agent, or Firm—Melvin A. Hunn

[57] ABSTRACT

The current invention is comprised of a method and apparatus for monitoring the condition of backup batteries, especially those associated with an on-line, uninterruptible power supply driving a critical load. This is accomplished by measuring an AC ripple current induced into the backup batteries by the UPS, comparing the amplitude of the AC ripple current to a low level limit and to a high level limit determined by the UPS operating parameters and the critical load, and indicating an alarm condition when the AC ripple current falls outside the range defined by the low level and high level limits. The present invention also provides an apparatus for monitoring the condition of backup batteries associated with an on-line UPS and includes an AC current probe connected to the backup batteries, an AC ammeter connected to the current probe for measuring the AC ripple current across the backup batteries, an alarm indicator connected to the AC ammeter, having both a high level and a low level detection means, which is activated when the amplitude of the AC ripple current falls outside the range defined by the low and high levels. Also, an AC ripple voltage created by the AC ripple current can be measured instead of the AC ripple current to determine the operational status of the batteries.

3 Claims, 2 Drawing Sheets

APPARATUS AND METHOD FOR MONITORING BACKUP BATTERY FLOW CHARGE

CROSS REFERENCE TO PROVISIONAL APPLICATION

This application claims the benefit of U.S. Provisional Application Ser. No. 60/007,776, entitled "Apparatus and Method for Monitoring Backup Battery Flow Charge", filed Nov. 30, 1995.

BACKGROUND OF THE INVENTION

1. Field of the Invention

The present invention relates to a method and apparatus for monitoring standby batteries. Specifically, the invention allows the user to monitor the high-frequency AC "ripple" current induced in the backup battery system of an on-line UPS caused by the rectifier/inverter switching of the UPS.

2. Background Information

The purpose of an uninterruptible power supply (UPS) is to provide continuous and well-regulated electrical power to equipment whose continuous and proper operation is critical. Backup battery systems associated with the UPS equipment act as a secondary energy source that is both continuous and instantly available during periods when the primary rectifier source is inoperative due to the loss of normally available commercial utility power. Generally speaking, the UPS is extremely reliable. However, the backup battery system is much less so. Approximately 80% of all UPS system failures are battery related.

The effectiveness of a UPS system is largely determined by the continuous readiness of the battery system. Owners of such systems have long recognized the importance of knowing the operational state of the battery system. Commercially available backup battery monitoring devices are in wide use today.

U.S. Pat. No. 4,138,670, issued to Schneider et al., discloses an improved alarm system, typically for fire and smoke detection, that runs off an AC power supply, but incorporates a battery backup for providing power in the event of AC failure. The system for battery backup includes circuitry for supervising the energy level of the battery backup and for providing a warning when the energy level decreases to a predetermined value. When the voltage across the battery falls below a predetermined level, the system energizes a horn to signal a warning that the batteries need to be replaced. U.S. Pat. No. 4,316,133, issued to Locke describes a system primarily directed to the charging of the battery backup system. The disclosed system controls the charging current as a function of both the temperature and the battery voltage. The system requires disconnection of the charging circuit in order to place a test load across the terminals of the battery to read the battery voltage. The measured battery voltage is then compared to a reference voltage based on the operating temperature of the battery.

In U.S. Pat. No. 4,618,857, issued to DuBois et al., a system for monitoring a battery voltage level and an AC power supply is described. This patent uses a separate power supply to power the circuitry used to monitor a drop in the voltage of the backup battery below a predetermined level. U.S. Pat. No. 4,929,931, issued to McCuen describes a system for monitoring a number of different conditions in a battery backup utilized as an auxiliary power source. The system detects the presence or absence of a backup battery, the voltage across the backup battery as compared to a nominal voltage level, and the discharge rate of the battery for comparison to a selected discharge rate. If the discharge rate is greater than the selected rate, a low-quality indicator is turned on. U.S. Pat. No. 5,047,961, issued to Simonsen discloses a multi-characteristic monitoring system for standby batteries. The system provides information on the duration of battery discharge and the total accumulated battery discharge power by measuring the battery float voltage, the ambient temperature of the battery, the recharge current, and the voltage during the initial recharge period. U.S. Pat. No. 5,218,288, issued to Mickal et al., describes a system that monitors the battery conditions by measuring average battery currents and battery voltages in determining whether or not the batteries are charging or discharging. The battery cell discharge power is computed and compared with reference curves to determine the residual capacity of the batteries.

Although battery monitoring devices are presently available for UPS systems, they are not without their problems. Typically, the prior art battery monitoring devices analyze traditional battery parameters, i.e., total DC battery voltage, individual DC battery voltage, and DC charge and discharge currents. Such analysis is problematic for one of two reasons. First, charge mode analysis reveals very little, if any, useful information about the battery's discharge capabilities. Since the battery is in a charge mode approximately 99% of the time, the value of such information is highly questionable. Second, discharge analysis requires either (1) system down time for testing, or (2) power failure operation of the battery system. In the first situation, when the system is down or off-line for testing, it is not available to perform its power protection function. In the other case, a previously unknown battery system defect (such as an open fuse) will still cause a UPS system failure where the only benefit from having employed such a monitoring device would be to have certain operational information concerning the failure. These traditional attempts at battery monitoring are largely ineffective because they are unable to predict the battery's ability to support rated capacity in the charge mode.

These prior art devices do little more than confirm what becomes known by more unfortunate means, and they incorporate no forewarning capability of impending battery failure. In addition, none of the prior art describes the means for measuring and monitoring the high-frequency AC "ripple" current seen at the terminals of a battery during the continuous charging functions of a typical battery backup system. In fact, many of the patents disclosed above function on the necessity of disconnecting the charging system when the test system is implemented on a periodic basis. None of the prior art appears to identify the existence of the AC ripple current described by the current invention.

SUMMARY OF THE INVENTION

It is an object of the present invention to determine the operational condition of a battery connected to an electrical system by monitoring the AC ripple current flowing through the battery.

It is another object of the present invention to provide an apparatus and method for monitoring the operational readiness of backup batteries in an on-line UPS without the necessity of removing the batteries from service.

It is an additional object of the present invention to provide an apparatus and method which utilizes the inverter/induced AC current within the DC battery system for the purpose of confirming inverter operation, normal UPS DC filter operation, backup battery condition, and battery-to-inverter connection.

It is a further object of the present invention to provide continuous visual display of the status of the inverter/induced AC current within the DC battery system.

It is an additional object of the present invention to provide a configuration which allows remotely located UPSs to be monitored for battery readiness.

Yet another object of the present invention is to provide a detecting means to compare the measured induced AC current with adjustable high and low limits, such that deviations outside the preset limits activate an alarm mechanism.

According to the present invention, the foregoing and other objects and advantages are attained by the device and method of the present invention which have practical application in a number of situations. The present invention comprises a method and apparatus for monitoring the condition of backup batteries, especially those associated with an on-line, uninterruptible power supply driving a critical load. This is accomplished by measuring an AC ripple current induced into the backup batteries by the UPS, comparing the amplitude of the AC ripple current to a low level limit and to a high level limit determined by the UPS operating parameters and the critical load, and indicating an alarm condition when the AC ripple current falls outside the range defined by the low level and high level limits. The present invention also provides an apparatus for monitoring the condition of backup batteries associated with an on-line UPS and includes an AC current probe connected to the backup batteries, an AC ammeter connected to the current probe for measuring the AC ripple current across the backup batteries, an alarm indicator connected to the AC ammeter, having both a high level and a low level detection means, which is activated when the amplitude of the AC ripple current falls outside the range defined by the low and high levels.

In yet another embodiment of the present invention, an AC ripple voltage created by the AC ripple current can be measured, instead of the AC ripple current, to determine the operational status of the batteries.

The above as well as additional objects, features, and advantages of the invention will become apparent in the following detailed description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
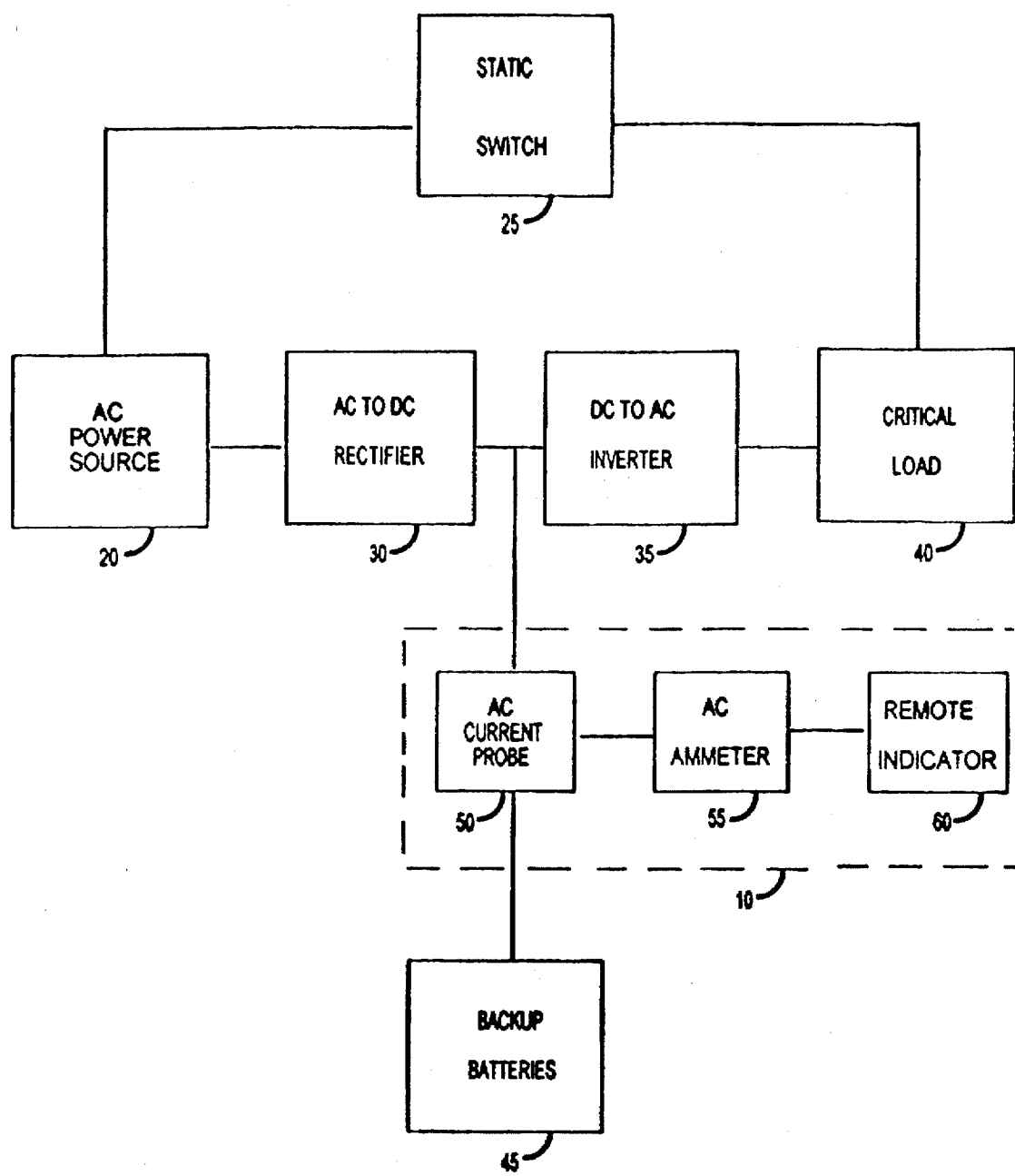
FIG. 1 is a block diagram of one embodiment of the invention, employing an AC current probe and AC ammeter.

Reference is made to FIG. 1, which shows a block diagram of a first embodiment of the present invention for a backup battery flow charge monitor (10) connected to a standard, uninterruptible power supply (UPS). The standard components for a UPS typically consist of an AC-to-DC rectifier (30) connected to an AC power source (20). The rectifier (30) is connected to the backup batteries (45) for the UPS and constantly provides a DC charging source as long as the AC power source (20) supplies power. The rectifier (30) is also connected to a DC-to-AC inverter (35) which converts the DC output from the rectifier (30) back to the AC power required by the critical load (40). Thus, in the typical UPS system operating under the normal conditions, the rectifier (30) simultaneously keeps the backup batteries (45) charged and powers the critical load (40) through the DC-to-AC inverter (35). If the input AC power source (20) is itself interrupted, the backup batteries (45) supply power through the inverter (35) to the critical load (40) until the AC power source (20) can be restored. If there is an internal failure of the UPS, the static switch (25) automatically switches to unconditioned power directly from the AC power source (20). The static switch (25) may also provide a manual means of transfer to normal electric supply power for repairs to the UPS components.

It is not generally known that backup batteries associated with an on-line UPS system conduct an AC current when the UPS is in operation. It is this induced or "ripple" AC current which can be measured and used diagnostically to determine the backup battery's state of readiness. The ripple current is induced into the backup battery system in the following way. As the inverter (35) begins to draw current from the rectifier (30), it loads the rectifier (30). As a result, the voltage across the rectifier (30) decreases slightly, causing the backup battery (45) to discharge in response to the reduced voltage across the rectifier (30). This discharge from the battery may also be referred to as "negative current". The negative current from the backup battery (45) adds to the current from the rectifier (30) producing a total current input to the inverter (35). As the current in the inverter (35) reaches a peak and then begins to decrease, the load seen by the rectifier (30) is lessened and the voltage across the rectifier (30) increases slightly creating a "positive current". In response to the increased rectifier voltage, the backup battery (45) charges due to the positive current.

Stated in another way, the backup batteries (45) assist the rectifier (30) during peak inverter (35) demands and then are recharged by the rectifier (30) as the current demands of the inverter (35) lessen. As a result of the inverter's continuously charging current demand on the rectifier (30) and the rectifier's inability to supply the current while maintaining a constant voltage, the backup batteries (45) become subjected to a high-frequency charge/discharge operation (approximately 300–400 Hz). By normal standards, the backup battery's operation is DC, but today's AC electrical components respond efficiently enough to detect and monitor the ripple current.

It is this ripple current induced into the backup battery system which is monitored by the device (10) of the present invention to provide diagnostic information regarding the status of the backup batteries (45). As shown in FIG. 1, an AC current probe (50) is connected between the rectifier (30) and the backup batteries (45). A typical AC current probe would be the Simpson 01293 current transformer. The AC current probe (50) should be sensitive enough to detect the AC ripple current. The required current level indicating proper backup battery readiness is determined by such factors as system KVA capacity, critical load current, and battery condition. In general, larger systems and larger load currents induce larger ripple battery currents, where typical battery currents range from 0.7 amps to 50 amps. An AC ammeter (55) is then connected to the AC current probe (50) to provide a reading on the ripple current detected within the backup system. The AC ammeter (55) used in one embodiment of the device is the Newport Electronics Q2060 DCR7.

Finally, a remote indicator (60) is connected to the AC ammeter (55) to monitor the ripple current characteristics and indicate an alarm condition if necessary. In this embodiment, the remote indicator is a Newport Q2001P fitted with a Sonalert SC110NS audible alarm. The remote indicator (60) also contains means (not shown) for setting a pre-selected high and low AC current amplitude limit defining an expected AC ripple current range outside of which an alarm condition is indicated. The remote indicator (60) alerts supervisory personnel through an audible or visible alarm or other type of indication.

The precise setting for the high and low pre-selected limits are based on a number of factors, including those mentioned above, associated with the UPS system and the critical load it drives. Once the nominal AC current level that exists within the properly working backup batteries (45) is determined, the battery monitor pre-selected limits are adjusted so that significant changes in the AC battery current are detected and relayed to supervisory personnel. For example, the typical battery failure causes an open circuit and results in a total loss of AC battery current. This condition is easily detected by the present invention and provides immediate notification of the need for corrective maintenance. Other detectable abnormalities which prevent proper UPS functioning include 1) defective or open battery disconnect, 2) open battery fuse, and 3) loose connections.

Figure 2:
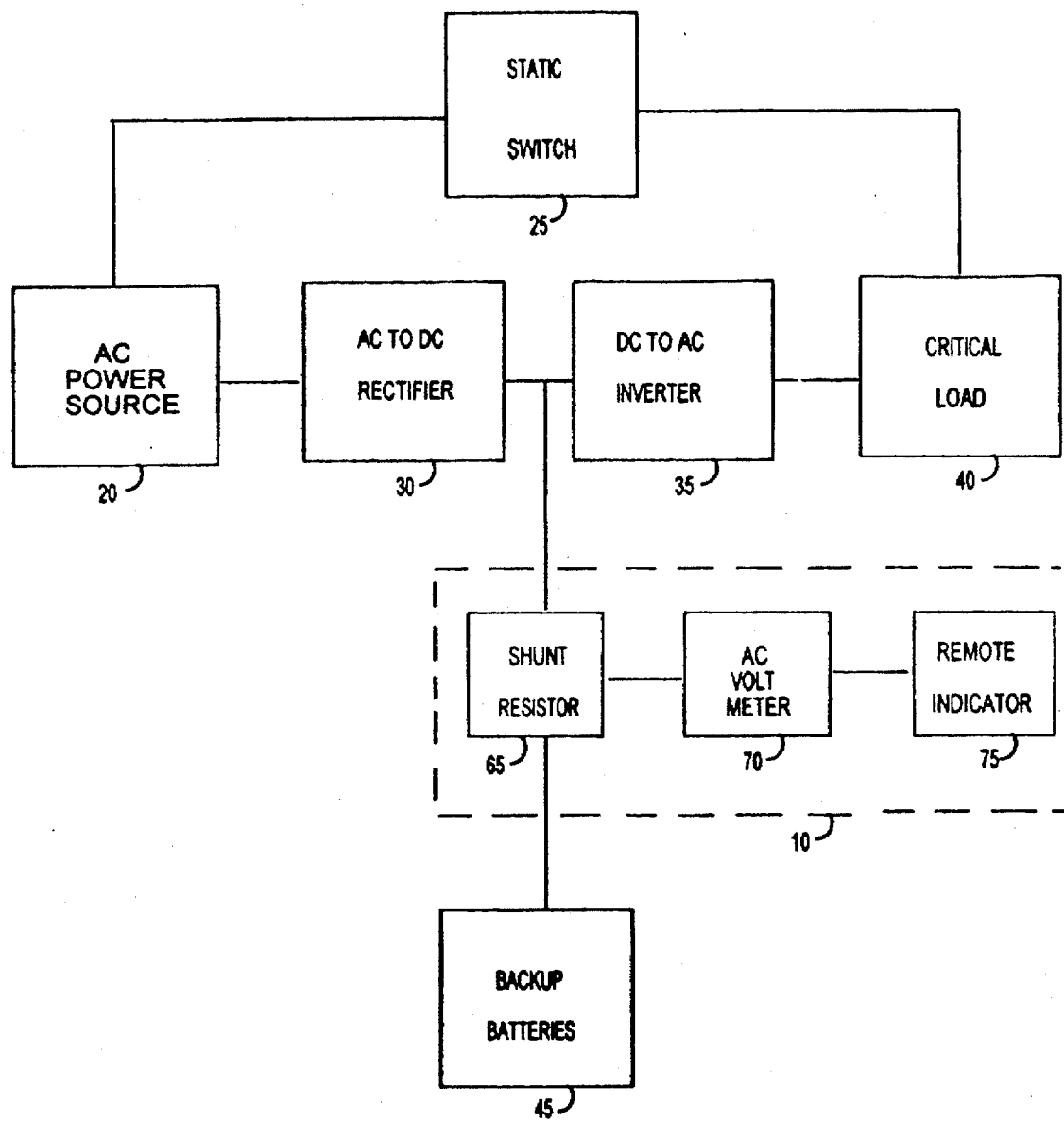
FIG. 2 is a block diagram of another embodiment of the invention, employing an AC voltmeter across a shunt resistor.

FIG. 2 shows an alternate embodiment for the device (10) of the present invention. In this embodiment, a shunt resistor (65) is connected in series with the rectifier (30) and the backup batteries (45). Many modern UPS devices come supplied with a shunt resister (65). While the resistance value of the shunt resister (65) may vary, typically it is approximately 0.01 Ohms. An AC voltmeter (70) is connected to the shunt resistor (65) in order to measure the voltage across the shunt resister (65). Although the measured voltage may vary, it is typically in the millivolt range. The AC voltmeter (70) should be sensitive enough to detect the small AC voltage across the shunt resister (65) caused by the AC ripple current induced into the backup batteries (45) by the rectifier (30)/inverter (35) interaction as previously described hereinabove. The voltage detected by the voltmeter (70) across the shunt resister (65) is directly proportional to the AC ripple current. Typically, the small ripple voltage on top of the DC voltage is between 0.5 volt and 1.5 volts AC. A remote indicator (75) is connected to the AC voltmeter (70). The remote indicator (75) has pre-selected high and low limits (not shown) which define a voltage range outside of which an alarm condition is indicated. The remote indicator (75) also contains an alarm for alerting supervisory personnel. The alarm may be audible or visible.

To summarize, the steps involved in monitoring the condition of the backup batteries in a UPS are as follows. First, depending on the specific system operating parameters and the load to which the UPS is supplying power, pre-selected high and low limits for the amplitude of the AC ripple current or voltage expected in the backup battery system are determined. The specific current level is determined by such factors as system KVA capacity, critical load current, and battery condition. Next, the AC ripple current or voltage within the backup battery system is monitored. When the amplitude for the measured AC value falls outside of the range defined by the pre-selected high and low limits, an alarm condition is produced and supervisory personnel are alerted. Corrective maintenance to the UPS, and in particular the backup batteries, may then be performed.

It is intended that the above descriptions of the preferred embodiments of the structure of the present invention and the description of the components used are but two enabling best mode embodiments for implementing the invention. Other applications are likely to be conceived of by those skilled in the art, which applications still fall within the breadth and scope of the disclosure of the present invention. The primary import of the present invention lies in its continuous monitoring of the condition of the backup battery system while the system remains on-line and available for use. Its benefits derive from its low cost and reliability. Again, it is understood that other applications of the present invention will be apparent to those skilled in the art upon a reading of the preferred embodiments and a consideration of the appended claims and drawings.

While I have shown my invention in only one of its forms, it is not just limited but is susceptible to various changes and modifications without departing from the spirit thereof.

I claim:

1. A method for determining a condition of a battery connected to an electrical system comprising:

a. monitoring an AC ripple current originating in said electrical system and flowing through said battery;

b. determining said condition of said battery from said AC ripple current;

c. comparing said AC ripple current to pre-selected limits; and d. indicating when said AC ripple current is not within said pre-selected limits.

2. An apparatus for determining a condition of a battery connected to an electrical system comprising an AC current measurement device, connected between said battery and said electrical system, for measuring an AC ripple current flowing through said battery comprising:

a. a current comparator device coupled to said AC current measurement device for comparing said AC ripple current to pre-selected limits; and b. an alarm condition indicator coupled to said current comparator device for communicating when said AC ripple current is not within said pre-selected limits.

3. An apparatus for determining a condition of a battery connected to an electrical system comprising a measurement means for measuring an AC ripple current originating in said electrical system and flowing through said battery comprising:

a. a comparing means for comparing said AC ripple current to pre-selected limits; and, b. an indication means for indicating an alarm condition when said AC ripple current is not within said pre-selected range.

* * * * *